United States Patent
Carney et al.

(10) Patent No.: US 6,239,592 B1
(45) Date of Patent: May 29, 2001

(54) TEST FIXTURE WITH QUICK CONNECT AND RELEASE BOARD INTERCONNECT MECHANISM

(75) Inventors: James M. Carney, Pepperell; Yvetta D. Pols, Winchester; Robert S. Antonuccio, Burlington; Joseph M. Spano, North Reading, all of MA (US); William A. Izzicupo, Windham, NH (US); Timothy M. Holland, West Boylston, MA (US); Lewis B. Sheen, III, Shirley, MA (US); Joseph J. Montagna, Acton, MA (US); Daniel D. Gonsalves, Hudson, NH (US)

(73) Assignee: Sun Microsystems, Inc., Palo Alto, CA (US)

( * ) Notice: Subject to any disclaimer, the term of this patent is extended or adjusted under 35 U.S.C. 154(b) by 0 days.

(21) Appl. No.: 09/324,414

(22) Filed: Jun. 2, 1999

(51) Int. Cl.[7] .................. G01R 1/04; G01R 31/02
(52) U.S. Cl. ............ 324/158.1; 324/754; 324/755; 324/758
(58) Field of Search ............ 324/158.1, 755, 324/761, 754, 758; 439/260, 259, 262, 267, 65

(56) References Cited

U.S. PATENT DOCUMENTS

| | | | |
|---|---|---|---|
| 4,922,191 | * | 5/1990 | Conover .................. 324/755 |
| 5,793,218 | * | 8/1998 | Oster et al. ............. 324/754 |

\* cited by examiner

Primary Examiner—Safet Metjahic
Assistant Examiner—Anjan K. Deb
(74) Attorney, Agent, or Firm—Kudirka & Jobse, LLP

(57) ABSTRACT

A test fixture which holds multiple circuit boards in an edge-to-edge configuration for testing includes a sliding interconnect mechanism which is located between the circuit boards under test. The interconnect mechanism includes an interconnect board on which are mounted pairs of inter-wired frame connectors which mate with the connectors on each of the printed circuit boards to be tested and electrically interconnect the boards. The interconnect mechanism includes guide pins on which the interconnect mechanism slides to accurately align the frame and board connectors and an actuating mechanism to move the interconnect mechanism into position to securely mate the aligned connectors. The actuating mechanism can also be reversed to unmate the connectors and release the boards under test after the tests are completed.

18 Claims, 5 Drawing Sheets

TEST FIXTURE WITH QUICK CONNECT AND RELEASE BOARD INTERCONNECT MECHANISM

FIELD OF THE INVENTION

This invention relates to test fixtures for electronic circuits and, more particularly, to test fixtures for simultaneously testing multiple printed circuit boards.

BACKGROUND OF THE INVENTION

Complex electronic circuits generally require extensive testing to ensure reliability and quality. This testing often involves measuring electrical parameters at selected points on the circuit board while the circuit is in operation. Modern circuit boards are often multilayered and have components and signal connections on both sides of the board so that it is necessary to have access to both sides in order to complete the testing. Because space is generally limited when circuit boards are mounted in a carrier or mounting device in the final product, it is often difficult to obtain access to the points on the circuit board necessary to complete testing. Consequently, during testing operations, circuit boards are often mounted in special test fixtures. The board can be inserted into such a fixture and temporarily held in place while power and ground are applied to the board so that the selected electrical parameters can be measured when the board is in its actual operational state.

In some cases, it is necessary for several boards to be tested simultaneously because the electronic circuits on each board interact with circuits on the other boards and the boards must be electrically connected together during the test procedure in order to fully test each board. Circuit boards are normally electrically connected to the remainder of the circuitry by means of connectors which establish multiple simultaneous connections. In the case of complex boards, such as mother boards, connections of the board to its normal mounting arrangement may be accomplished by several multiple connector pairs which together require a significant amount of force to mate and unmate.

Consequently, it is desirable to provide a test fixture in which multiple circuit boards can be inserted and electrically connected together during testing.

It is further desirable to provide a test fixture in which multiple circuit boards can be connected with an interconnect mechanism which can be quickly connected and released without requiring time-consuming alignment of the connector portions.

SUMMARY OF THE INVENTION

In accordance with one illustrative embodiment of the invention, a test fixture holds multiple circuit boards in an edge-to-edge configuration. A sliding interconnect mechanism is mounted on the test fixture and is located between the circuit boards under test. The interconnect mechanism includes an interconnect board on which are mounted pairs of inter-wired frame connectors which mate with the connectors on each of the printed circuit boards to be tested and electrically interconnect the boards. The interconnect mechanism includes guide pins on which the interconnect mechanism slides to accurately align the frame and board connectors and an actuating mechanism to move the interconnect mechanism into position to securely mate the aligned connectors. The actuating mechanism can also be reversed to unmate the connectors and release the boards under test after the tests are completed.

In accordance with one embodiment of the invention, the sliding interconnect mechanism comprises a rigid mounting plate which supports the board to insure alignment accuracy and the strength needed for multiple matings and unmatings of the frame connectors on the interconnect board with the connectors on the circuit boards under test.

BRIEF DESCRIPTION OF THE DRAWINGS

The above and further advantages of the invention may be better understood by referring to the following description in conjunction with the accompanying drawings in which.

DETAILED DESCRIPTION

Figure 1:
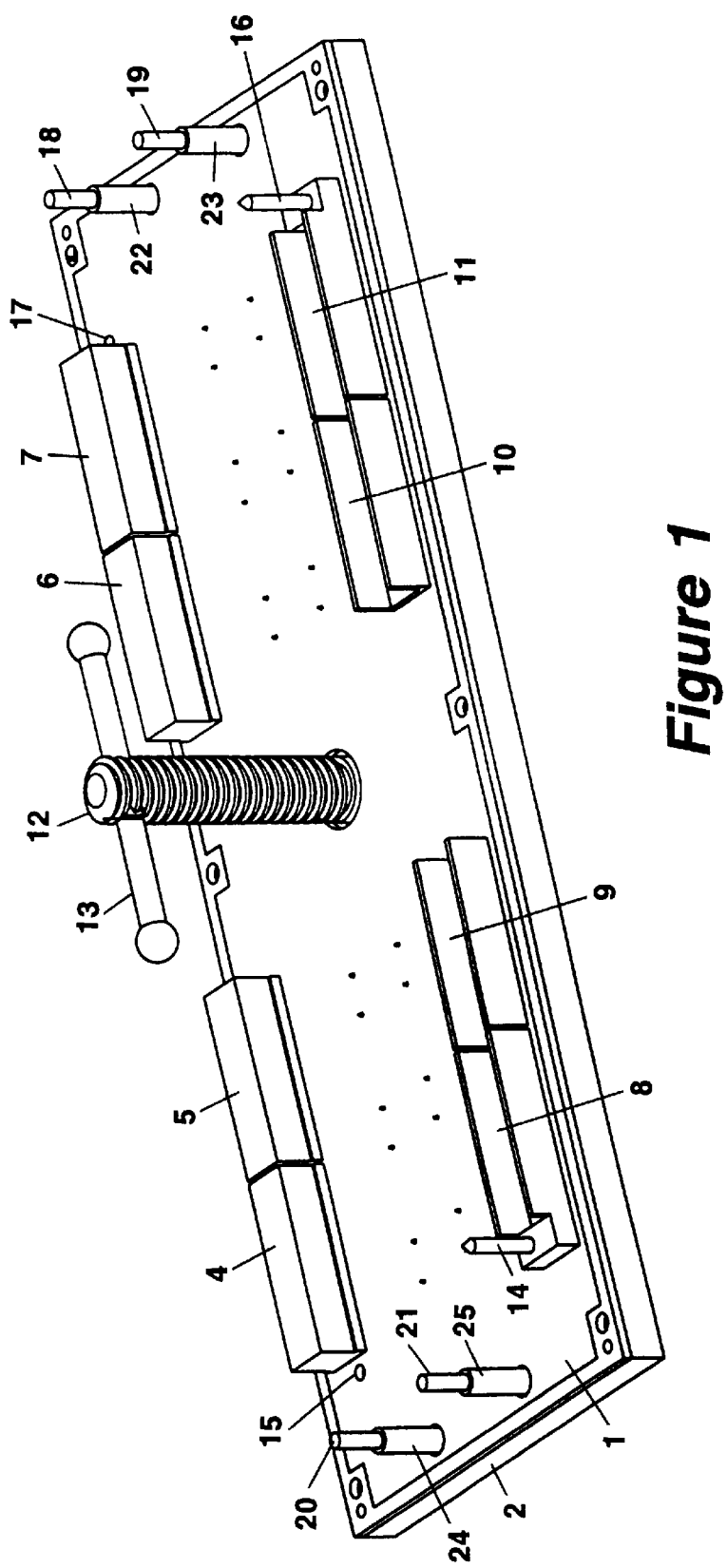
FIG. 1 is a perspective view of the interconnect mechanism showing the interconnect board and the screw mechanism.

FIG. 1 is a perspective view of the inventive interconnect mechanism. The interconnect mechanism comprises a circuit board 1 which contains the inter-wired frame connectors 4–11 that establish the electrical connections for testing purposes. Board 1 contains a number of circuit traces on its lower side (not shown) which interconnect the frame connectors 4–11, that are mounted on board 1. Alternatively, the frame connectors may be wired together with discrete wiring. The circuit board 1 is mounted on a rigid frame 2. For example, rigid frame 2 may be comprised of metal, such as aluminum. Frame 2 supports board 1 to provide mechanical rigidity to hold the connectors in position during the mating and unmating operations.

As shown in FIG. 1, four male frame connectors, 4, 5, 6 and 7 are illustrated which connectors are opposed by four female frame connectors, 8, 9, 10 and 11. This connector configuration would be used to interconnect two printed circuit boards under test that would be plugged together during normal operation conditions. Other connector configurations may also be used. The connectors 4–11 include conventional pins and sockets which have been omitted from FIG. 1 to clarify the figure. In addition, the female connectors 8 and 9 contain a locating pin 14 in which fits into a hole in the printed circuit board under test and aligns the frame connectors with the board connectors as the printed circuit board under test is mated with the interconnect board. A similar locating pin 16 is associated with female connectors 10 and 11. Male connectors 4 and 5 have a hole 15 associated therewith which receives the locating pin from the female connectors (not shown) on the associated circuit board under test. A similar hole 17 also accepts a locating pin from the mating female connectors (not shown) on the circuit board under test.

In the connector arrangement shown in FIG. 1, the frame connectors are arranged in pairs. For example, male connector 4 has a corresponding female connector 8. Similarly, male connector 5 has a corresponding female connector 9. As mentioned previously, the pins and sockets in these connectors can be connected together in parallel to allow two printed circuit boards under test which would normally be plugged together to be plugged separately into the circuit board 1. In this manner, the printed circuit boards can be tested in an edge-to-edge configuration as will be illustrated in FIG. 5. Similarly, connectors 6 and 7 are arranged in pairs with female connectors 10 and 11.

In some cases, the number of connectors, and the specific connectors used in the system, may require a substantial amount of force to mate and unmate the connectors. For example, a conventional connector used to connect two circuit boards is a model HDM connector manufactured by Teradyne of Boston, Mass. When eight of these connectors are used, as illustrated in FIG. 1, approximately 40–60 lbs. of force is required to properly mate and unmate the connectors. When the interconnect mechanism is used to connect boards having such connectors, the mating force must be equally distributed across the entire connector array in order to avoid damaging the connectors. The rigid mounting plate 2 supports the circuit board 1 to properly apply the force.

In order to provide for a mating of the connectors without requiring an operator to manually align the connectors, the mounting plate 2 is provided with an alignment mechanism comprising alignment posts 18, 19, 20 and 21 which slide into holes in the test fixture as will be hereinafter described. Spacers 22, 23, 24 and 25 limit the travel of the interconnection mechanism relative to the text fixture to insure proper fit with the connectors on the printed circuit boards under test. Other guide mechanisms, such as jointed arms can also be used.

Figure 4:
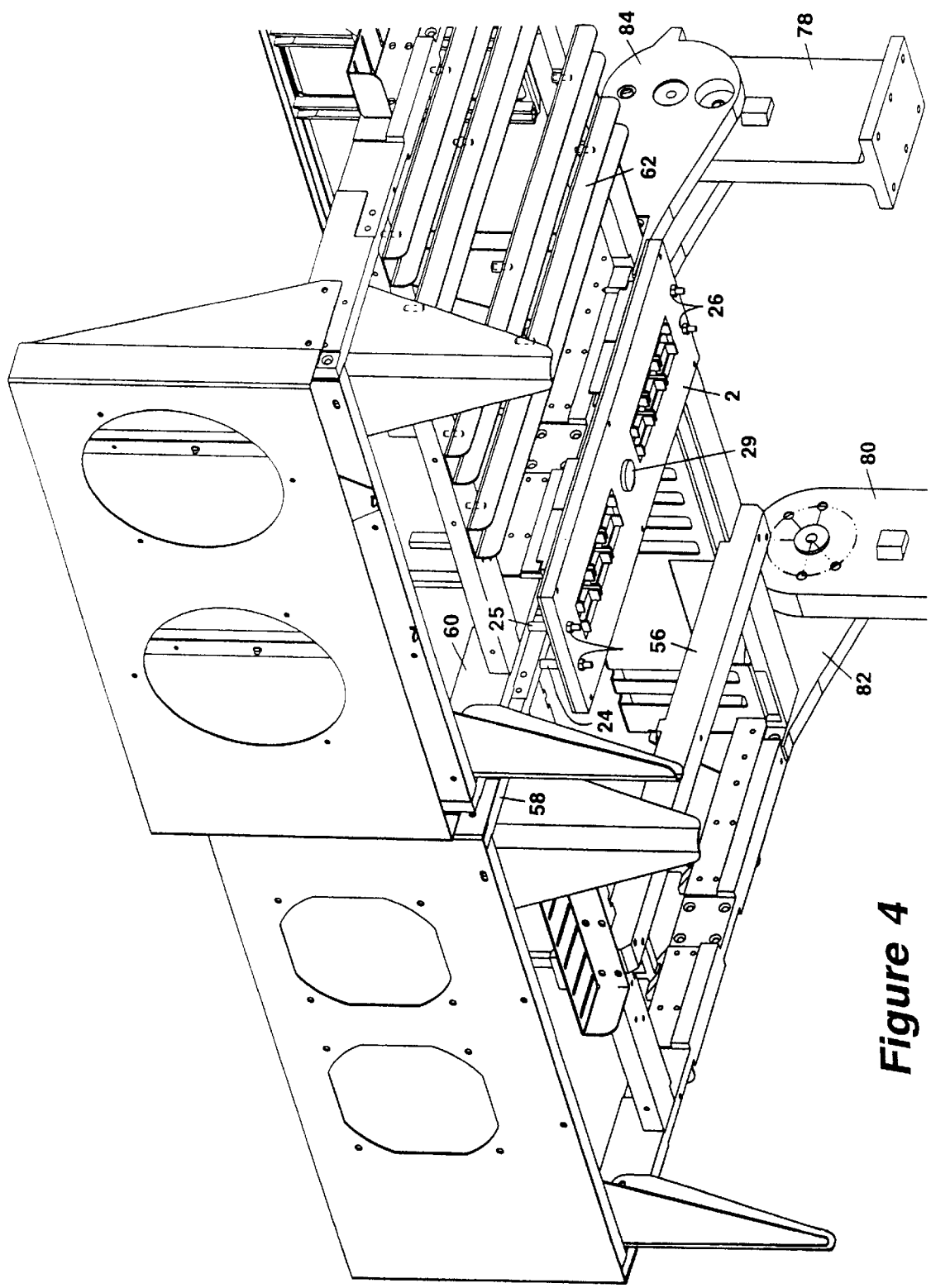
FIG. 4 is an underside view of the same test fixture illustrating in more detail how the interconnect mechanism is mounted on the test fixture.
Figure 5:
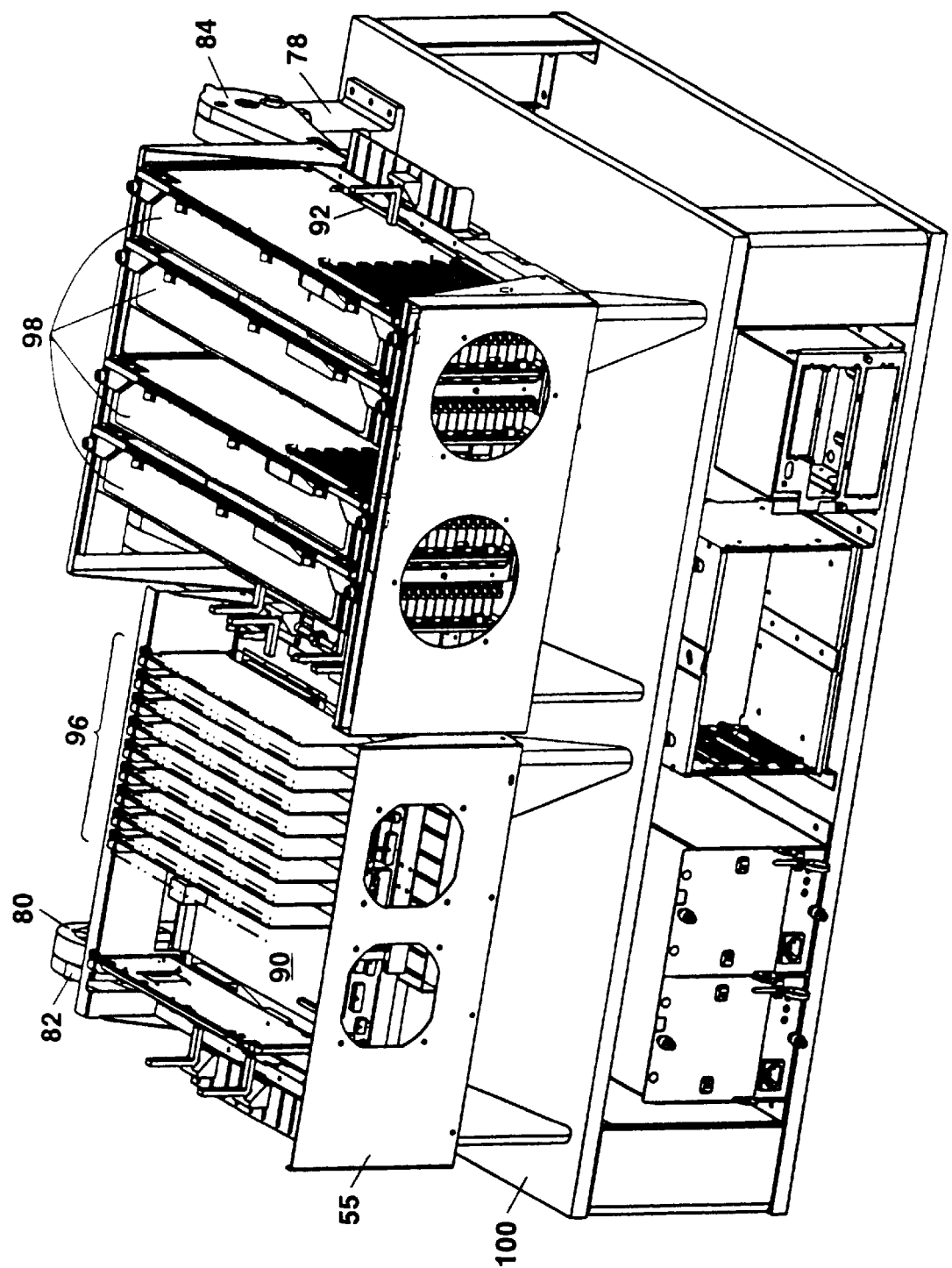
FIG. 5 is a perspective view of the test fixture showing printed circuit boards under test mounted in the test fixture with peripheral boards inserted into the boards under test.

The board 1 is can be moved relative to the text fixture by means of an actuating mechanism which includes screw 12 which can be turned by a handle 13. Screw 12 can also be turned via a socket 12A which receives the bit of a conventional torque driver. Screw 12 fits into a threaded hole in the test fixture, as shown in FIGS. 4 and 5, and drives the interconnect mechanism up and down to properly mate and unmate the connectors. Other actuating mechanisms, such as levers or hydraulic mechanisms can also be used.

Figure 2:
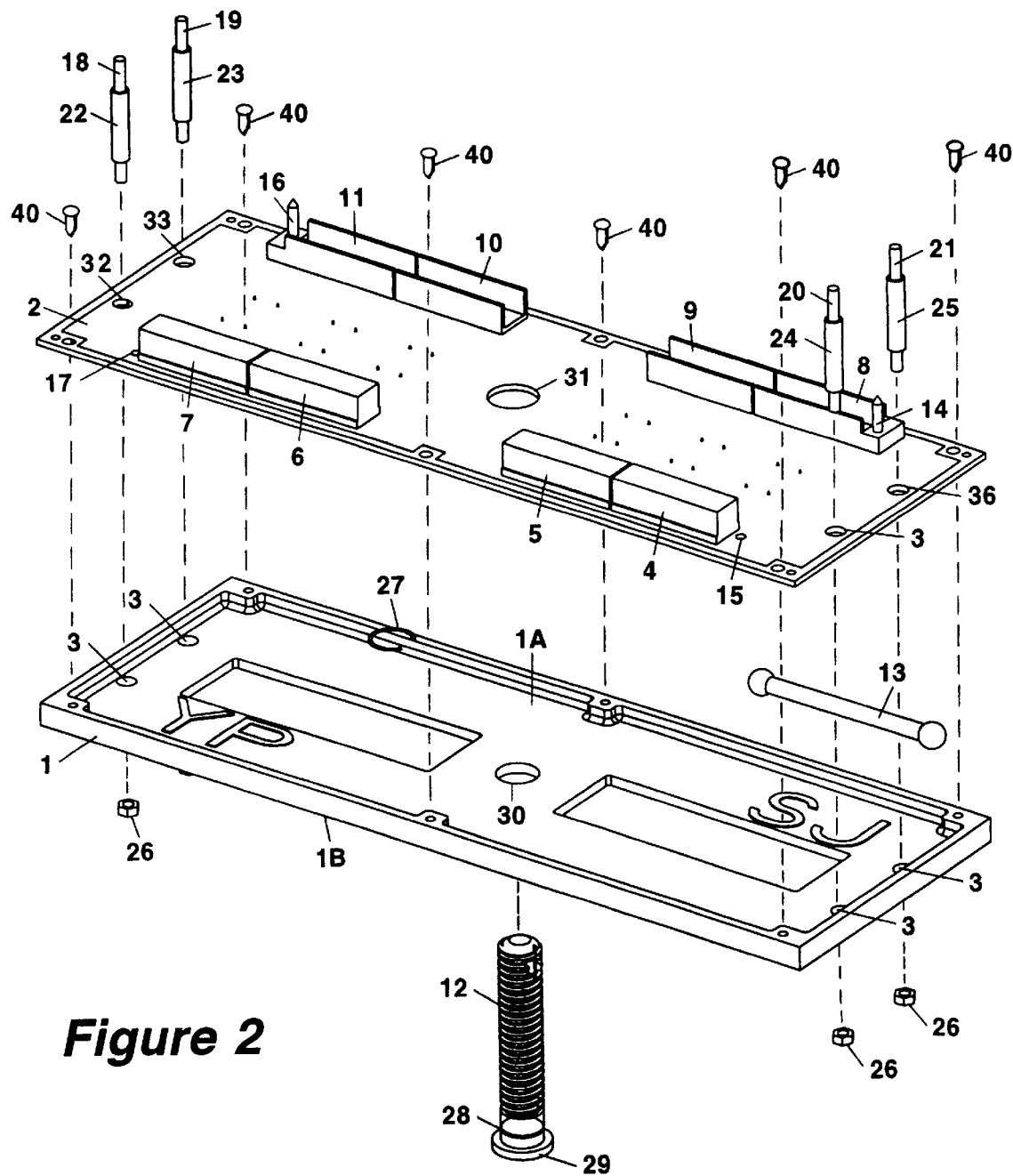
FIG. 2 is an exploded diagram of the interconnect mechanism.

FIG. 2 is an exploded diagram of the interconnection mechanism illustrated in Figure and illustrates some additional features of the interconnection mechanism. In particular, screw 12 includes a head 29 and is inserted through holes 30 and 31 of the frame 2 and circuit board 1, respectively, such that head 29 bears against the lower surface 2B of frame 2 and draws the frame 2 upward as the screw 12 is turned. A snap ring 27 fits into groove 28 and bears against the upper surface 2A of frame 2 so that the frame 2 is forced downwards as the screw is reversed in order to unmate the connectors.

The guide posts 18–21 pass through holes 32–35 in printed circuit board 1 and through holes 36–39 in frame 2. Each of the guide posts 18–21 has a shoulder which rests against surface 2A of frame 2 so that each guide post can be secured to frame 2 by means of nuts 26 which engage threaded ends of guide posts 18–21. Tubular spacers 22–25 slide over guide posts 18–21, through holes 32–35 of printed circuit board, respectively, and rest against the upper surface 2A of the frame 2. Printed circuit board 1 is secured to the frame 2 by means of screws 40, as illustrated in FIG. 2.

Figure 3:
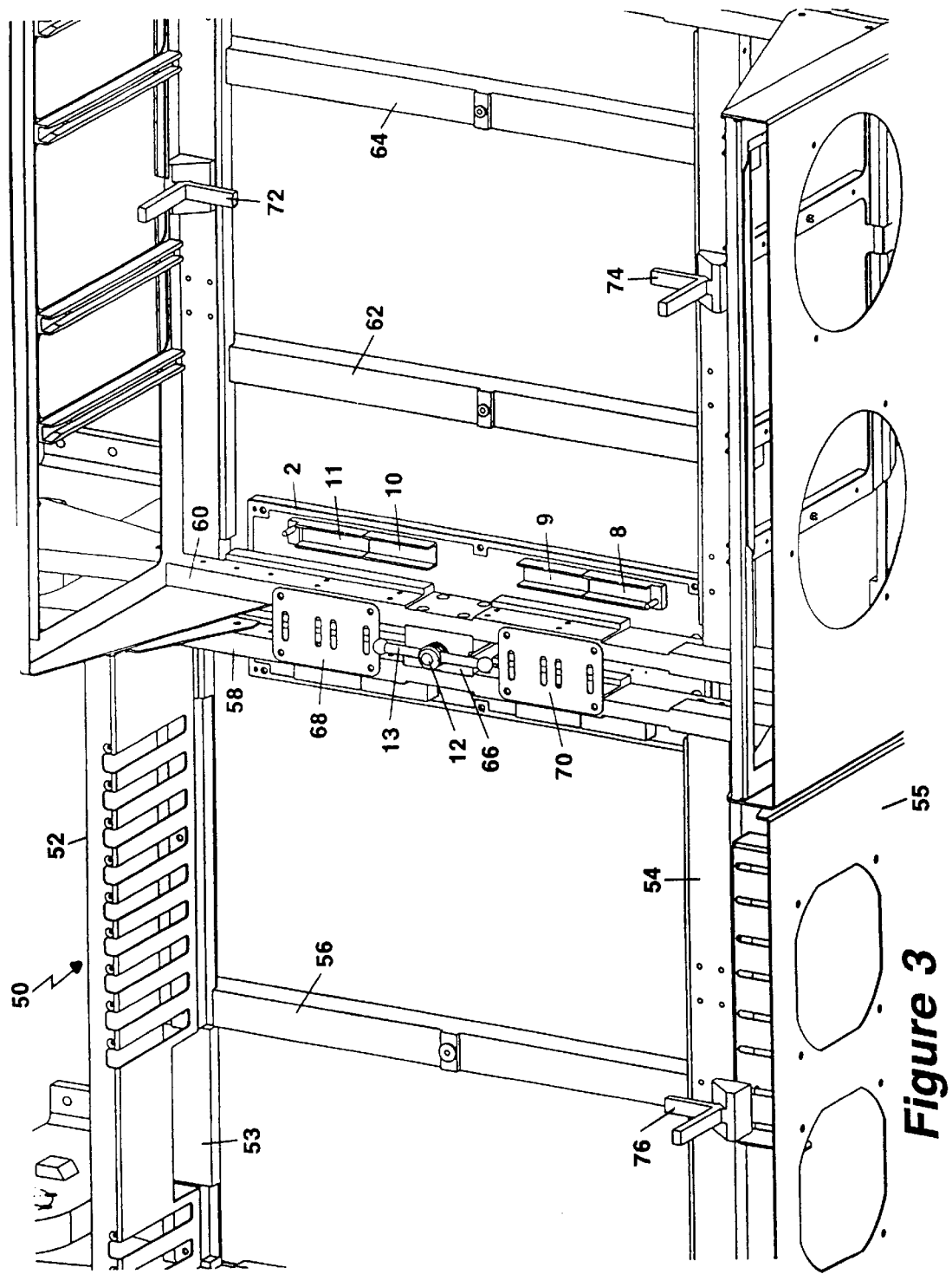
FIG. 3 is a picture of an illustrative test fixture showing the inventive interconnect mechanism mounted on the test fixture.

FIG. 3 shows the inventive interconnection mechanism mounted on an illustrative test fixture. Text fixture 50 consists of a housing that includes side panels 52 and 55 which are attached to side rails 53 and 54. Rails 53 and 54 are separated by a number of spacers 56, 58, 60, 62 and 64 to form a platform which supports the printed circuit boards under test. Spacers 58 and 60 contain an adjustment block 66 mounted between them which has a threaded hole that accepts the screw 12. In addition, spacers 58 and 60 contain vertical holes in which the guide posts 18–21 of the interconnection board slide. Spacers 58 and 60 may also have mounting plate 68 and 70 attached thereto for attaching various holddowns, of which holddowns 72, 74 and 76 are shown, for temporarily fastening the printed circuit boards under test to the test fixture. As shown in FIG. 3, when the screw 12 is turned, the interconnection mechanism is drawn upward as the guide posts 18–22 slide into the holes in spacers 58 and 60. This upward movement causes the connectors 4–11 to mate with corresponding connectors on the underside of the printed circuit boards which are held in the fixture. Consequently, the printed circuit boards are electrically connected together and can be tested as a unit.

FIG. 4 shows the underside of the test fixture 50 illustrated in FIG. 3. In this arrangement, the test fixture 50 is mounted on arms 82 and 84 which are pivotally attached to stands 78 and 80. The pivoted connection allows the test fixture 50 to be swung up so that the underside of the printed circuit boards under test can be reached easily. FIG. 4 illustrates the inventive interconnection board in its uppermost position at which point the guide posts 18–21 have fully slid into their holes in spacers 58 and 60 such that the tubular spacers (spacers 24 and 25 are shown) contact the undersides of the fixture spacers 58 and 60 limiting the upward travel of the interconnection board.

FIG. 5 illustrates the illustrative test fixture 50 with printed circuit boards 90 and 92 inserted therein. The test fixture 50 mounts on a test bed 100 which may contain additional test equipment. Each of the printed circuit boards under test 90 and 92 contains additional peripheral boards which can be plugged into connectors on the printed circuit board under test. For example, peripheral boards 96 are plugged into printed circuit board under test 90 whereas printed circuit boards 98 are plugged into printed circuit board under test 92. In particular, boards 90 and 92 are connected by means of the inventive interconnection board so that the whole structure is then electrically interconnected and can be tested as a unit.

Although an exemplary embodiment of the invention has been disclosed, it will be apparent to those skilled in the art that various changes and modifications can be made which will achieve some of the advantages of the invention without departing from the spirit and scope of the invention. For example, it will be obvious to those reasonably skilled in the art that, although the description was directed to a particular hardware configuration, other hardware could be used in the same manner as that described. Other aspects, such as modifications to the specific screw mechanism and guide arrangements disclosed which achieve the same function, as well as other modifications to the inventive concept are intended to be covered by the appended claims.

What is claimed is:

1. A quick connect and release board interconnect mechanism for use in a test fixture which holds multiple circuit boards under test, each of which has board connectors thereon which board connectors must be electrically interconnected to form a board configuration in order to perform a test on the board configuration, the interconnect mechanism comprising:

a rigid frame;

a plurality of electrically interconnected frame connectors mounted on the frame;

an actuating mechanism connected to the test fixture and to the frame which actuating mechanism moves the frame with respect to the test fixture; and a mechanism for guiding the frame as it moves so that so that the frame connectors mate with the board connectors and establish an electrical connection between the circuit boards under test.

2. An interconnect mechanism according to claim 1 wherein the plurality of electrically interconnected frame connectors are mounted on a circuit board and the circuit board is mounted on the frame.

3. An interconnect mechanism according to claim 2 wherein the circuit board is a printed circuit board containing traces which electrically interconnect the frame connectors.

4. An interconnect mechanism according to claim 1 wherein the actuating mechanism comprises a screw which extends from the text fixture to the frame.

5. An interconnect mechanism according to claim 1 wherein the actuating mechanism can be reversed to unmate the frame connectors and the board connectors.

6. An interconnect mechanism according to claim 1 wherein the guiding mechanism comprises a sliding connection between the test fixture and the frame which maintains frame orientation as the frame moves.

7. An interconnect mechanism according to claim 6 further comprising a spacer which limits movement of the frame.

8. An interconnect mechanism according to claim 7 wherein the spacer is part of the guiding mechanism.

9. An interconnect mechanism according to claim 1 wherein the frame is comprised of metal.

10. A test fixture which holds multiple circuit boards under test, each of which has board connectors thereon which board connectors must be electrically interconnected to form a board configuration in order to perform a test on the board configuration, the text fixture comprising:

a housing;

a platform mounted in the housing for holding the circuit boards under test in a configuration in which board connectors on each circuit board are in physical proximity;

a rigid frame;

a plurality of electrically interconnected frame connectors mounted on the frame;

an actuating mechanism connected between the housing and the frame which actuating mechanism moves the frame with respect to the housing; and a mechanism for guiding the frame as it moves so that so that the frame connectors mate with the board connectors and establish an electrical connection between the circuit boards under test.

11. A test fixture according to claim 10 wherein the plurality of electrically interconnected frame connectors are mounted on a circuit board and the circuit board is mounted on the frame.

12. A test fixture according to claim 11 wherein the circuit board is a printed circuit board containing traces which electrically interconnect the frame connectors.

13. A test fixture according to claim 10 wherein the actuating mechanism comprises a screw which extends from the housing to the frame.

14. A test fixture according to claim 10 wherein the actuating mechanism can be reversed to unmate the frame connectors and the board connectors.

15. A test fixture according to claim 10 wherein the guiding mechanism comprises at least one post which slides into a hole in the housing.

16. A test fixture according to claim 15 further comprising a spacer which limits movement of the frame.

17. A test fixture according to claim 16 wherein the spacer is part of the guiding mechanism.

18. A test fixture according to claim 10 wherein the frame is comprised of metal.

* * * * *